US011982951B2

United States Patent
Wang et al.

(10) Patent No.: US 11,982,951 B2
(45) Date of Patent: May 14, 2024

(54) PRINTING HEAD AND METHOD FOR APPLYING A CORRECTION FOR MOUNTING DEVIATION OF LIGHT-EMITTING CHIPS

(71) Applicant: Avision Inc., Hsinchu (TW)

(72) Inventors: Jian-Zhi Wang, Hsinchu (TW); Yen-Cheng Chen, Hsinchu (TW); Lun Wang, Hsinchu (TW)

(73) Assignee: AVISION INC., Hsinchu (TW)

( * ) Notice: Subject to any disclaimer, the term of this patent is extended or adjusted under 35 U.S.C. 154(b) by 21 days.

(21) Appl. No.: 17/865,840

(22) Filed: Jul. 15, 2022

(65) Prior Publication Data
US 2023/0074299 A1 Mar. 9, 2023

(30) Foreign Application Priority Data
Sep. 6, 2021 (TW) .................. 110133100

(51) Int. Cl.
*G03G 15/04* (2006.01)
*H01L 25/075* (2006.01)

(52) U.S. Cl.
CPC .... *G03G 15/04036* (2013.01); *H01L 25/0753* (2013.01)

(58) Field of Classification Search
CPC ........ G03G 15/04036; G03G 15/04054; H01L 25/0753; H01L 25/50; B41J 2/435
See application file for complete search history.

(56) References Cited

U.S. PATENT DOCUMENTS

| 11,429,034 B2 * | 8/2022 | Yagi ................. G03G 15/04054 |
| 2020/0406544 A1 | 12/2020 | Rubin Ben Haim et al. |

FOREIGN PATENT DOCUMENTS

| CN | 110450541 A | 11/2019 |
| TW | 201137542 A | 11/2011 |
| TW | M460780 U | 9/2013 |
| TW | 201417334 A | 5/2014 |

* cited by examiner

*Primary Examiner* — Walter L Lindsay, Jr.
*Assistant Examiner* — Geoffrey T Evans
(74) *Attorney, Agent, or Firm* — McClure, Qualey & Rodack, LLP

(57) ABSTRACT

A printing head and a method for applying a correction for mounting deviation of light-emitting chips are provided. The printing head includes a plurality of light-emitting chips. Each light-emitting chip includes a plurality of primary light-emitting elements that are continuously arranged. At least one of two adjacent light-emitting chips further includes at least one spare light-emitting element continuously and linearly arranged after the primary light-emitting elements. If the two adjacent light-emitting chips are both at a target mounting position, first N light-emitting units of one of the two light-emitting chips respectively face to first N light-emitting units of the other one of the two light-emitting chips, where N≥1. Each two of the light-emitting units facing to each other form a group. One of the two light-emitting units in each of the groups is set to a light emission disabled state.

22 Claims, 11 Drawing Sheets

PRINTING HEAD AND METHOD FOR APPLYING A CORRECTION FOR MOUNTING DEVIATION OF LIGHT-EMITTING CHIPS

CROSS-REFERENCE TO RELATED APPLICATION

This non-provisional application claims priority under 35 U.S.C. § 119(a) to Patent Application No. 110133100 filed in Taiwan, R.O.C. on Sep. 6, 2021, the entire contents of which are hereby incorporated by reference.

BACKGROUND

Technical Field

The present invention relates to light-sensitive printing technologies, and in particular, to a method for applying a correction for mounting deviation of light-emitting chips of a light-sensitive printing head, and a printing head capable of applying a correction for mounting deviation of light-emitting chips.

Related Art

At present, a light source used by the light-sensitive printing technology mainly includes a laser and a light-emitting element array. The laser requires a high-speed rotary polygon prism for scanning, and needs a relatively complex mechanism. The light-emitting element array may selectively control, to light, a light-emitting element at a corresponding position in the light-emitting element array that needs to be exposed, and does not need a complex mechanism. Therefore, the light-emitting element array becomes a trend in the industry.

However, the light-emitting element array often needs to be composed of a plurality of light-emitting modules. If a position between the light-emitting modules has a deviation from a predetermined position, the distribution uniformity of printing points may be influenced.

SUMMARY

In view of this, the present invention provides a method and printing head for applying a correction for mounting deviation of light-emitting chips, so that when the mounting deviation of the light-emitting chip occurs, a position of a light-emitting point can be adjusted, and printing points can be uniformly distributed.

A printing head for applying a correction for mounting deviation of light-emitting chips includes a substrate and a plurality of light-emitting chips. The light-emitting chips are arranged on the substrate along an axis and staggered at intervals on two sides of the axis. Each light-emitting chip includes a plurality of primary light-emitting elements linearly arranged in parallel to the axis. A first chip and a second chip in the light-emitting chip that are adjacent to each other each have an adjacent end. The first chip further includes at least one first spare light-emitting element located on the adjacent end and continuously and linearly arranged after the primary light-emitting elements. If the first chip and the second chip are both at a target mounting position, the first spare light-emitting elements of the first chip respectively face to first N primary light-emitting elements of the second chip that are located on the adjacent end, each two of the light-emitting elements facing to each other form a group, each first spare light-emitting element is set to a light emission disabled state, and N is a quantity of the first spare light-emitting elements.

A method for applying a correction for mounting deviation of light-emitting chips is applicable to the printing head. The method includes: measuring a transverse spacing between vertical projections, on the axis, of first primary light-emitting elements of the first chip and the second chip that are located on the adjacent end; determining whether the transverse spacing falls within a mounting tolerance interval; and if the transverse spacing falls within the mounting tolerance interval, setting each first spare light-emitting element of the first chip to a light emission disabled state.

In some embodiments, the second chip further includes at least one second spare light-emitting element located on the adjacent end and continuously and linearly arranged after the primary light-emitting elements. If the first chip and the second chip are both at a target mounting position, second spare light-emitting elements of the second chip respectively face to first M primary light-emitting elements of the first chip that are located on the adjacent end, each two of the light-emitting elements facing to each other form a group, each second spare light-emitting element is set to a light emission disabled state, and M is a quantity of the second spare light-emitting elements.

In some embodiments, the primary light-emitting elements and the spare light-emitting elements are arranged at a same adjacent spacing.

In some embodiments, the mounting tolerance interval is in a range of 0.4-1.6 times the adjacent spacing.

In some embodiments, the method for applying a correction for mounting deviation of light-emitting chips further includes: determining whether the transverse spacing falls within a low width sub-interval; and if the transverse spacing falls within the low width sub-interval less than a standard sub-interval, shortening a light-emitting duration of the first primary light-emitting element of the second chip that is located on the adjacent end.

In some embodiments, the low width sub-interval is in a range of 0.4-0.5 times the adjacent spacing.

In some embodiments, the method for applying a correction for mounting deviation of light-emitting chips further includes: determining whether the transverse spacing falls within a high width sub-interval; and if the transverse spacing falls within the high width sub-interval greater than a standard sub-interval, prolonging a light-emitting duration of the first primary light-emitting element of the second chip that is located on the adjacent end.

In some embodiments, the high width sub-interval is in a range of 1.5-1.6 times the adjacent spacing.

In some embodiments, if the transverse spacing is greater than the mounting tolerance interval, each first spare light-emitting element of the first chip that faces to each primary light-emitting element of the second chip is set to a light emission disabled state, each first spare light-emitting element of the first chip that does not face to each primary light-emitting element of the second chip is set to a light emission enabled state, and each second spare light-emitting element of the second chip is set to a light emission disabled state.

In some embodiments, if the transverse spacing is greater than the mounting tolerance interval, each first spare light-emitting element of the first chip is set to a light emission disabled state, each second spare light-emitting element of the second chip that faces to each primary light-emitting element of the first chip is set to a light emission disabled state, and each second spare light-emitting element of the second chip that faces to each primary light-emitting element of the first chip is set to a light emission enabled state.

In some embodiments, the transverse spacing is in a range of 1.6-2 times the adjacent spacing.

In some embodiments, if the transverse spacing is less than the mounting tolerance interval, each first spare light-emitting element of the first chip and each second spare light-emitting element of the second chip are set to a light emission disabled state. The primary light-emitting element of the second chip that is located on the adjacent end and faces to the primary light-emitting element of the first chip is set to a light emission disabled state.

In some embodiments, if the transverse spacing is less than the mounting tolerance interval, each first spare light-emitting element of the first chip and each second spare light-emitting element of the second chip are set to a light emission disabled state. The primary light-emitting element of the first chip that is located on the adjacent end and faces to the primary light-emitting element of the second chip is set to a light emission disabled state.

In some embodiments, the transverse spacing is less than 0.4 times the adjacent spacing.

Based on the above, embodiments of the present invention provide a method and a printing head for applying a correction for mounting deviation of light-emitting chips. A specific light-emitting unit can be set to a light emission enabled state or to a light emission disabled state when the mounting deviation of the light-emitting chips occurs. Slight mounting deviation can be adjusted by controlling the light-emitting duration. In this way, the printing head can be uniformly exposed, and the printing definition can be enhanced. In addition, steps for adjustment are concise and convenient.

DETAILED DESCRIPTION

Figure 1:
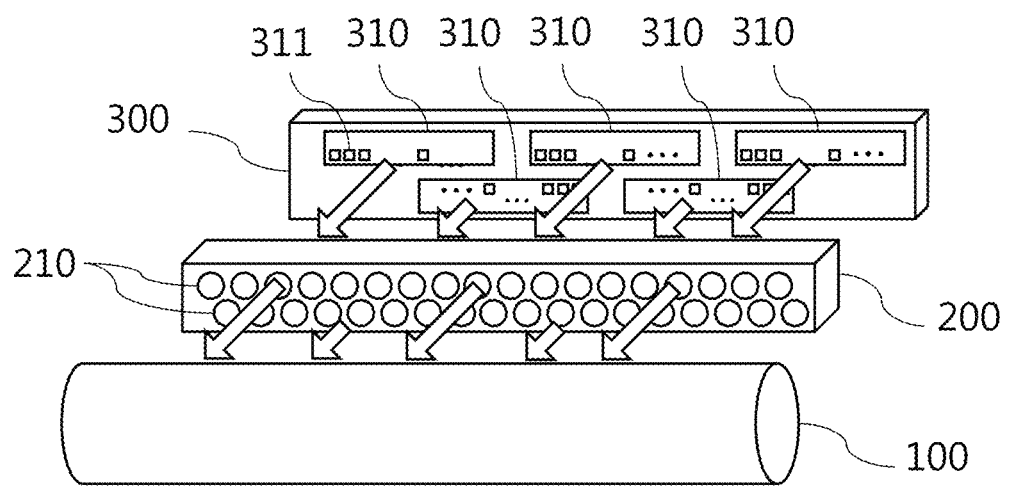
FIG. 1 is a schematic diagram of a printing head in a usage state according to an embodiment of the present invention.

A plurality of implementations of the present invention are disclosed below with reference to drawings. For clear description, many practical details are described together in the following descriptions. However, it should be understood that such details in practice should not be used to limit the disclosure. In other words, practical details are not necessary in some implementations of the disclosure. In addition, to simplify the drawings, some conventional structures and components are shown in the drawings in a simple schematic manner.

FIG. 1 is a schematic diagram of a printing head in a usage state according to an embodiment of the present invention. The printing head may be disposed in a printing device, such as a printer, a photocopier, and the like. The printing head includes a light-emitting module 300 and a lens array 200, and is configured to output light toward a photosensitive drum 100. A portion of the photosensitive drum 100 that is configured to receive light generates a photoelectric effect to adsorb toner, so as to print files.

Figure 2:
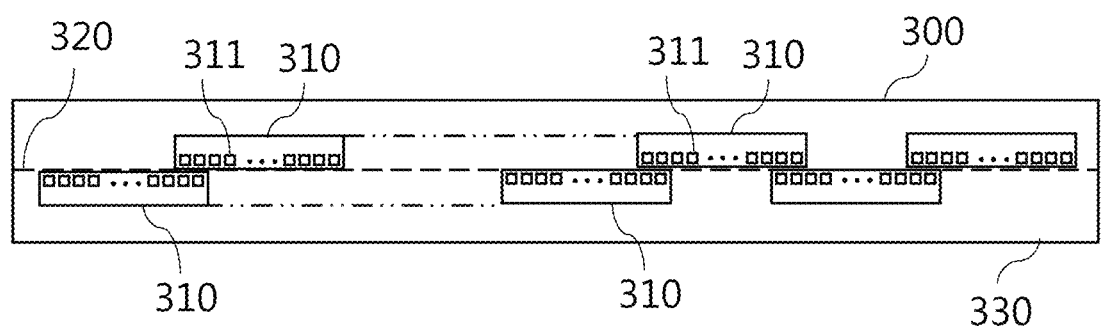
FIG. 2 is a schematic diagram of a light-emitting module according to an embodiment of the present invention.

FIG. 2 is a schematic diagram of the light-emitting module 300 according to an embodiment of the present invention. The light-emitting module 300 includes a plurality of light-emitting chips 310 and a substrate 330. The light-emitting chips 310 are arranged on the substrate 330 along an axis 320 and staggered at intervals on two sides of the axis 320. Each light-emitting chip 310 includes a plurality of light-emitting units 311 arranged in parallel to the axis 320. The light-emitting units 311 are located on a side of the each light-emitting chip 310 that is close to and adjacent to the axis 320. Herein, the light-emitting units 311 are light-emitting thyristors, or may be light-emitting devices, such as light-emitting diodes, but the present invention is not limited thereto. The light-emitting chips 310 are in a long shape. The light-emitting units 311 are arranged in series along a long axis of the light-emitting chip 310. Herein, the light-emitting module 300 is in a long shape. The axis 320 is parallel to a direction of a long axis of the light-emitting module 300.

Referring to FIG. 1 again, the lens array 200 includes a plurality of lens units 210 arranged in two rows corresponding to the light-emitting units 311, so as to correspondingly receive rays of light (as shown by arrows in the figure) outputted by the light-emitting units 311. In this way, the rays of light may be calibrated to be outputted to the photosensitive drum 100 (as shown by arrows in the figure). Therefore, although the light-emitting chips 310 are respectively disposed on two sides of the long axis of the light-emitting module 300, from a macroscopical view, the exposure of the photosensitive drum 100 is in a straight line. In other words, the light-emitting units 311 on each light-emitting chip 310 are arranged in series according to a density of printing resolution. From the macroscopical view, the light-emitting units 311 on the light-emitting chips 310 are also arranged in series according to the density of printing resolution. That is to say, the density (in the direction of the long axis of the light-emitting chip 310) between the light-emitting units 311 is the quantity of the light-emitting units 311 within a unit length generally by dots per inch (dpi). For example, an A4 paper having 600 dpi printed is used as an example. The quantity of the light-emitting chips 310 on the light-emitting module 300 varies depending on different printing sizes. For example, the light-emitting module 300 having the printing resolution of 600 dpi has 20 light-emitting chips 310. In some embodiments, depending on different printing paper sizes such as A4, A3, and A1, one light-emitting module 300 may have 10-60 light-emitting chips 310. Similarly, the quantity of the light-emitting units 311 on each light-emitting chip 310 also varies depending on different lighting control methods. In some embodiments, one light-emitting chip 310 may have 200-300 light-emitting units 311.

Figure 3:
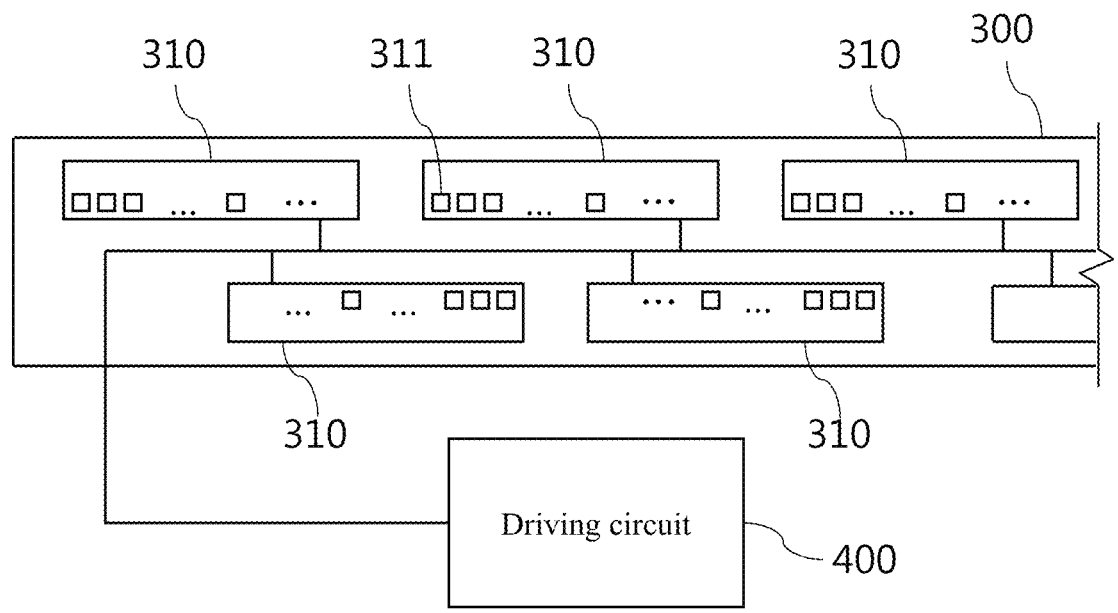
FIG. 3 is a schematic block diagram of a printing head according to an embodiment of the present invention.
Figure 4:
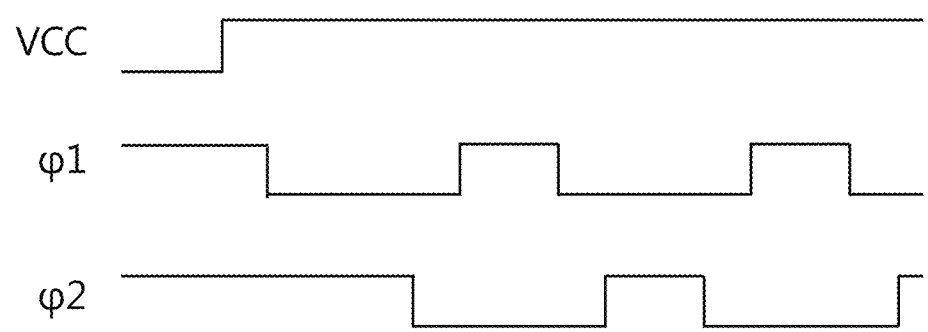
FIG. 4 is a schematic diagram of a control signal according to an embodiment of the present invention.
Figure 5:
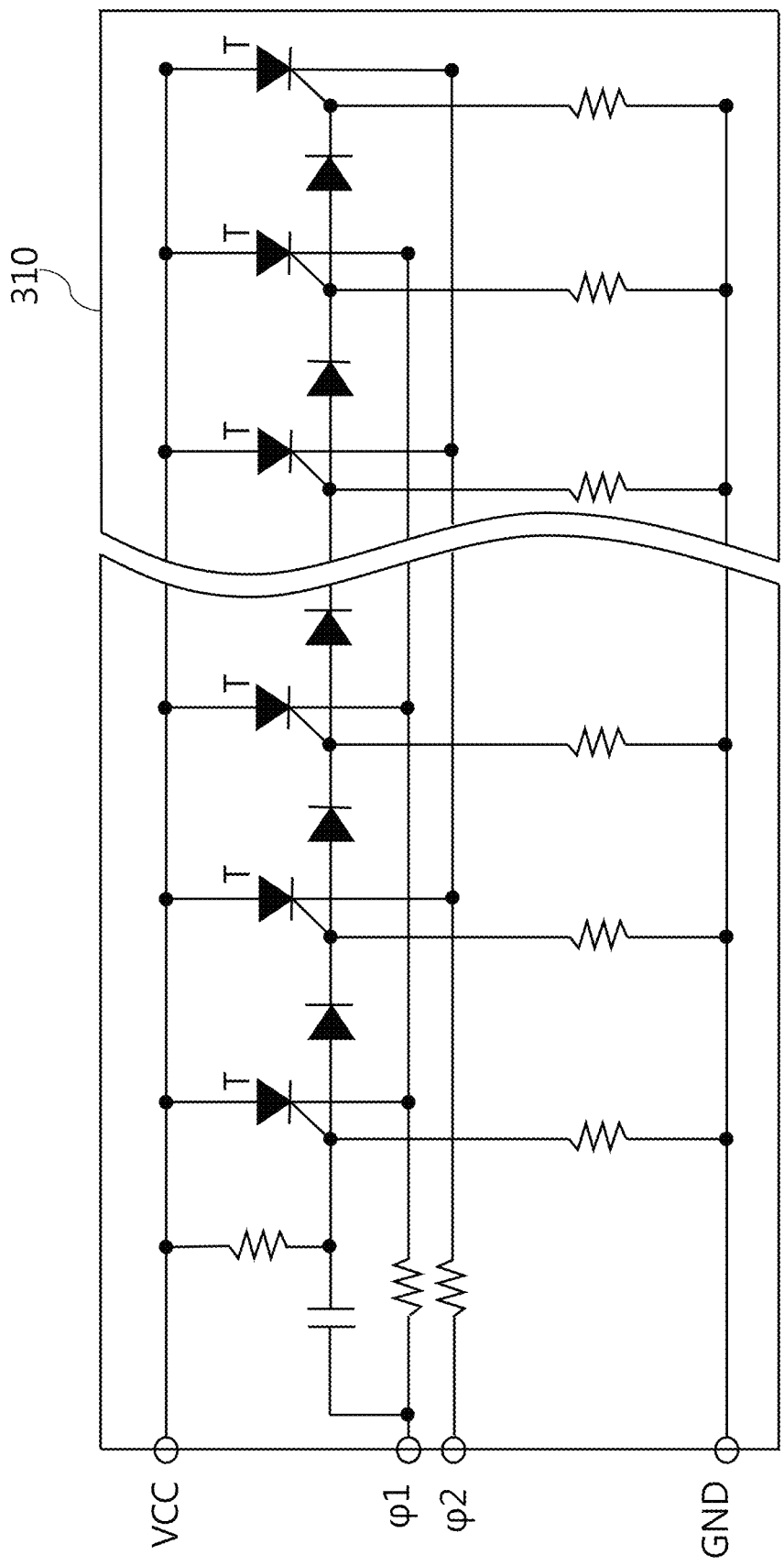
FIG. 5 is a schematic diagram of a shift circuit according to an embodiment of the present invention.

FIG. 3 is a schematic block diagram of a printing head according to an embodiment of the present invention. The printing head further includes a driving circuit 400. The driving circuit 400 is connected to the light-emitting units 311 of each light-emitting chip 310 in the light-emitting module 300, so as to drive the light-emitting units 311 to light in order. Refer to FIG. 4 and FIG. 5 together. FIG. 4 is a schematic diagram of a control signal according to an embodiment of the present invention. FIG. 5 is a schematic diagram of a shift circuit according to an embodiment of the present invention. The light-emitting chip 310 has a shift circuit. In other words, the shift circuit is integrated on an integrated circuit. The shift circuit includes a power signal line VCC, a grounding signal line GND, a first shift signal line φ1, and a second shift signal line φ2, and is connected to the driving circuit 400. The shift circuit is configured to receive a control signal transmitted by the driving circuit 400 by using the signal lines, so as to control the light-emitting units 311 to light. For detailed operation principles, refer to U.S. Pat. No. 10,843,484.

Figure 6A:
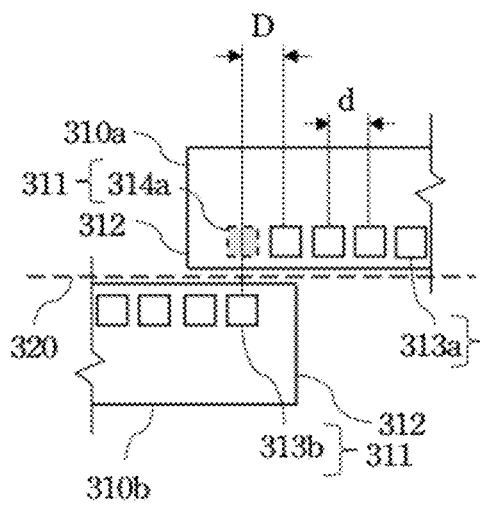
FIG. 6A is a schematic diagram of a light-emitting chip at a target mounting position according to a first implementation of an embodiment of the present invention.

FIG. 6A is a schematic diagram of a light-emitting chip 310 at a target mounting position (that is, a predicted placing position during engineering design) according to a first implementation of an embodiment of the present invention. A first chip 310a and a second chip 310b in the light-emitting chips 310 that are adjacent to each other each have an adjacent end 312. The light-emitting units 311 arranged in series include a plurality of primary light-emitting elements continuously arranged. That is to say, the primary light-emitting elements on the same light-emitting chip 310 are linearly arranged in parallel to the axis 320. For ease of distinguishing, each primary light-emitting element located on the first chip 310a is referred to as "a first primary light-emitting element 313a", and each primary light-emitting element located on the second chip 310b is referred to as "a second primary light-emitting element 313b" below. The first chip 310a further includes at least one spare light-emitting element (which is referred to as "a first spare light-emitting element 314a" below) located on the adjacent end 312 and continuously and linearly arranged after the first primary light-emitting elements 313a. In this implementation, a quantity of the first spare light-emitting elements 314a is one.

In this specification, the primary light-emitting elements (shown by a solid line square in the figure) and the spare light-emitting element (shown by a dashed line square in the figure) may be elements having a same structure. Unless otherwise specified herein, the primary light-emitting element is preset to a light emission enabled state, and the spare light-emitting element is preset to a light emission disabled state. The light emission enabled state (shown by an unfilled square in the figure) indicates a photosensitive light source that may serve as a printing point. The photosensitive light source may be lighted when data points are required to be printed, and is not lighted when the data points are not required to be printed. The light emission disabled state (shown by a filled square in the figure) indicates a photosensitive light source that does not serve as the printing point, which is not lighted regardless of whether the data point is required to be printed or not. The primary light-emitting elements and the spare light-emitting elements on the light-emitting chips 310 form the light-emitting unit 311. How to set each primary light-emitting element and each spare light-emitting element to a light emission disabled state or a light emission enabled state will be further described in detail below.

If the first chip 310a and the second chip 310b are both at a target mounting position, the first spare light-emitting elements 314a of the first chip 310a respectively face to first N second primary light-emitting elements 313b of the second chip 310b that are located on the adjacent end 312. Each two of the light-emitting elements facing to each other form a group. N is a quantity of the first spare light-emitting elements 314a (that is, N≥1). In this implementation, as shown in FIG. 6A, N is 1. One of the two light-emitting elements in each of the groups is set to a light emission disabled state, and the other one of the two light-emitting elements is set to a light emission enabled state, so that positions of the data points can be uniformly exposed.

The primary light-emitting elements and the spare light-emitting elements on the same light-emitting chip 310 are arranged at a same adjacent spacing d. A transverse spacing D exists between vertical projections, on the axis 320, of first primary light-emitting elements (that is, the first one first primary light-emitting element 313a and the first one second primary light-emitting element 313b) of the first chip 310a and the second chip 310b that are located on adjacent end 312. If the first chip 310a and the second chip 310b are both at the target mounting position, the transverse spacing D is substantially equal to the adjacent spacing d. In some embodiments, if a printing resolution is 600 dpi, the transverse spacing D is 42.3 μm. If the printing resolution is 1200 dpi, the transverse spacing D is 21.15 μm.

Figure 6B:
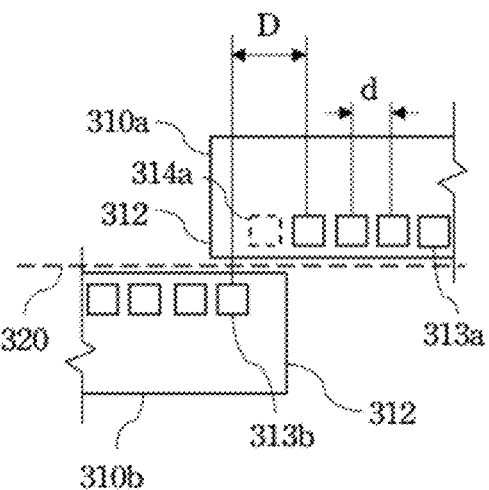
FIG. 6B is a schematic diagram of a light-emitting chip outward expanded and shifted according to a first implementation of an embodiment of the present invention.
Figure 6C:
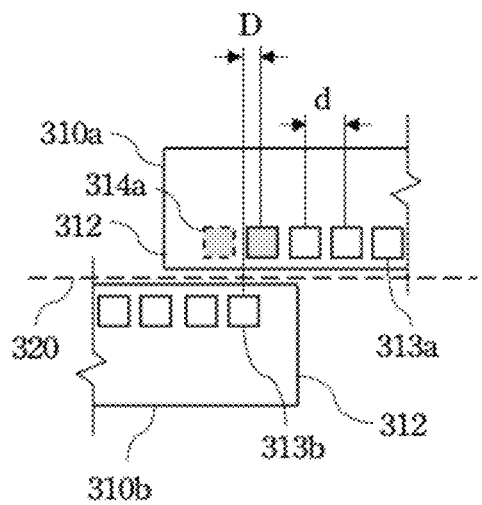
FIG. 6C is a schematic diagram of a light-emitting chip inward shifted according to a first implementation of an embodiment of the present invention.

FIG. 6B is a schematic diagram of a light-emitting chip 310 outward shifted according to a first implementation of an embodiment of the present invention. Referring to FIG. 6A and FIG. 6B, compared with the target mounting position in FIG. 6A, the first chip 310a and the second chip 310b are relatively away from each other in FIG. 6B. That is to say, the first chip 310a and the second chip 310b overlap each other by a relatively small area. FIG. 6C is a schematic diagram of a light-emitting chip 310 inward shifted according to a first implementation of an embodiment of the present invention. Referring to FIG. 6A and FIG. 6C, compared with the target mounting position in FIG. 6A, the first chip 310a and the second chip 310b are relatively close to each other in FIG. 6C. That is to say, the first chip 310a and the second chip 310b overlap each other by a relatively large area. How to correct the mounting deviation of the light-emitting chip 310 in the two cases will be described below, so that the positions of the data points can be uniformly exposed.

Figure 11:
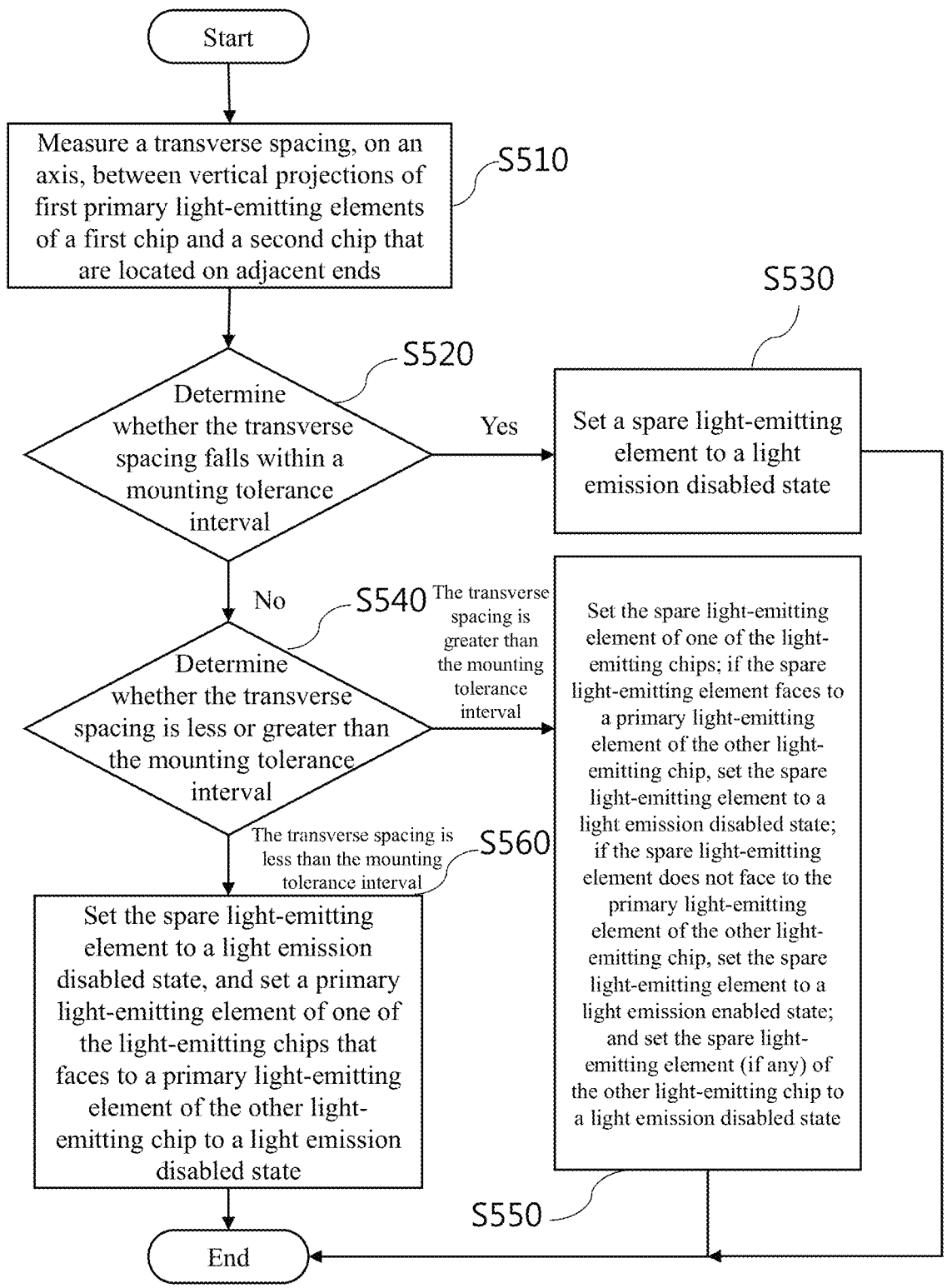
FIG. 11 is a flowchart of a method for applying a correction for mounting deviation of light-emitting chips according to an embodiment of the present invention.

FIG. 11 is a flowchart of a method for applying a correction for mounting deviation of light-emitting chips according to an embodiment of the present invention. After the light-emitting chip 310 is mounted on the substrate 330, the method for applying a correction for mounting deviation of light-emitting chips may be performed. First, a transverse spacing D between vertical projections, on the axis 320, of first primary light-emitting elements (that is, the first one first primary light-emitting element 313a and the first one second primary light-emitting element 313b) of the first chip 310a and the second chip 310b that are located on adjacent end 312 is measured (step S510). In some embodiments, measurement may be performed by using a machine vision measurement technology. An image is taken by using a microscope camera, and a value of the transverse spacing D in the image is obtained by means of measurement. Then, it is determined whether the transverse spacing falls within a mounting tolerance interval (step S520). If so, it indicates that the deviation is within a tolerance range. Therefore, the spare light-emitting element is maintained in an unused state, and each first spare light-emitting element 314a of the first chip 310a is set to a light emission disabled state (step S530). If not, it is determined whether the transverse spacing D is less or greater than the mounting tolerance interval (step S540).

FIG. 6B shows a situation (outward shifting) that the transverse spacing D of the light-emitting chip 310 according to the first implementation is greater than the mounting tolerance interval. For ease of correction, only the light-emitting chips 310 on a side of the axis 320 may be corrected. As shown in FIG. 6B, in step S550, since the second chip 310b has no spare light-emitting elements, the first chip 310a is corrected. Specifically, if the first spare light-emitting element 314a faces to the second primary light-emitting element 313b, the first spare light-emitting element is set to a light emission disabled state. If the first spare light-emitting element 314a does not face to the second primary light-emitting element 313b, the first spare light-emitting element is set to a light emission enabled state. In the first implementation, the first chip 310a only has one first spare light-emitting element 314a on the adjacent end 312, and the first spare light-emitting element 314a does not face to the second primary light-emitting element 313b. Therefore, the first spare light-emitting element 314a is set to a light emission enabled state.

FIG. 6C shows a situation (inward shifting) that the transverse spacing D of the light-emitting chip 310 according to the first implementation is less than the mounting tolerance interval. For ease of correction, only the light-emitting chips 310 on a side of the axis 320 may be corrected. As shown in FIG. 6C, in step S560, the first chip 310a is corrected. Specifically, the first spare light-emitting element 314a is set to a light emission disabled state. The first primary light-emitting element 313a of the first chip 310a that is located on the adjacent end 312 and faces to the second primary light-emitting element 313b of the second chip 310b is set to a light emission disabled state.

Figure 6D:
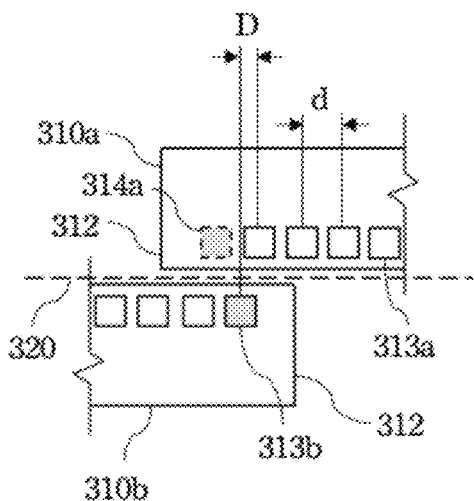
FIG. 6D is another schematic diagram of a light-emitting chip inward shifted according to a first implementation of an embodiment of the present invention.

FIG. 6D is another schematic diagram of a light-emitting chip 310 inward shifted according to a first implementation of an embodiment of the present invention. The same as FIG. 6C, FIG. 6D also shows a situation (inward shifting) that the transverse spacing D of the light-emitting chip 310 according to the first implementation is less than the mounting tolerance interval. FIG. 6D shows another implementation of step S560. That is to say, the second primary light-emitting element 313b of the second chip 310b that is located on the adjacent end 312 and faces to the first primary light-emitting element 313a of the first chip 310a is set to a light emission disabled state, and the first spare light-emitting element 314a is still set to a light emission disabled state.

In some embodiments, the mounting tolerance interval is in a range of 0.4-1.6 times the adjacent spacing d. The transverse spacing D greater than the mounting tolerance interval is in a range of 1.6-2 times the adjacent spacing d. The transverse spacing D less than the mounting tolerance interval is less than 0.4 times the adjacent spacing d.

Figure 7A:
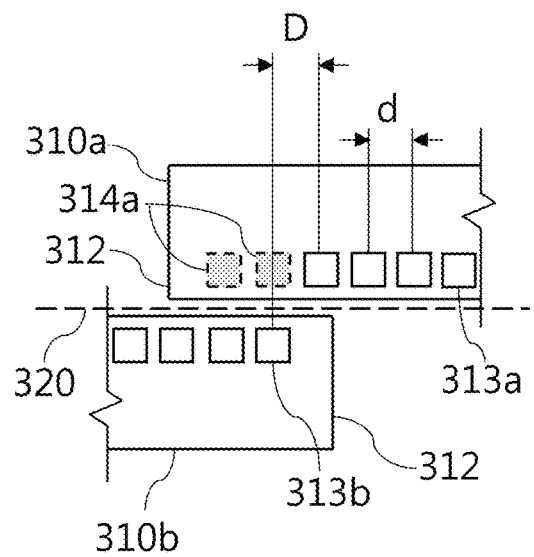
FIG. 7A is a schematic diagram of a light-emitting chip at a target mounting position according to a second implementation of an embodiment of the present invention.

FIG. 7A is a schematic diagram of a light-emitting chip 310 at a target mounting position according to a second implementation of an embodiment of the present invention. A difference between the second implementation and the first implementation lies in that, a quantity of the first spare light-emitting elements 314a of the first chip 310a that is on the adjacent end 312 in the second implementation is two. That is to say, two first spare light-emitting elements 314a of the first chip 310a respectively face to first N second primary light-emitting elements 313b of the second chip 310b that are located on the adjacent end 312, where N=2. Each two of the light-emitting elements facing to each other form a group.

Figure 7B:
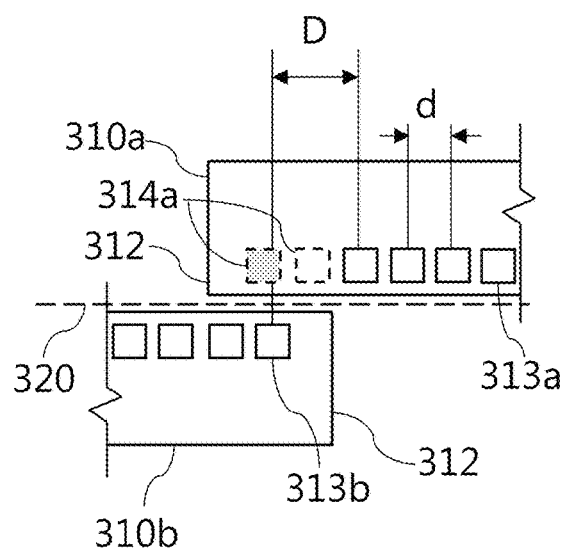
FIG. 7B is a schematic diagram of a light-emitting chip outward shifted according to a second implementation of an embodiment of the present invention.

FIG. 7B is a schematic diagram of a light-emitting chip 310 outward shifted according to a second implementation of an embodiment of the present invention. In step S550, since the second chip 310b has no spare light-emitting elements, spare light-emitting elements of the first chip 310a are set. Specifically, since the first one first spare light-emitting element 314a faces to the second primary light-emitting element 313b, the first spare light-emitting element is set to a light emission disabled state. Since the second first spare light-emitting element 314a does not face to the second primary light-emitting element 313b, the first spare light-emitting element is set to a light emission enabled state.

Figure 7C:
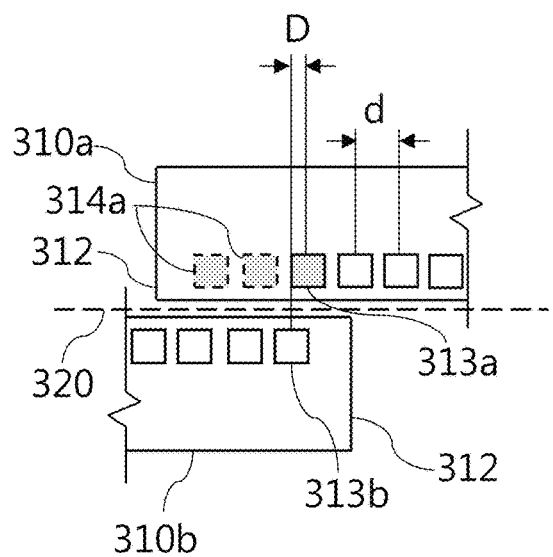
FIG. 7C is a schematic diagram of a light-emitting chip inward shifted according to a second implementation of an embodiment of the present invention.

FIG. 7C is a schematic diagram of a light-emitting chip 310 inward shifted according to a second implementation of an embodiment of the present invention. In step S560, the first spare light-emitting element 314a is set to a light emission disabled state. The first primary light-emitting element 313a of the first chip 310a that is located on the adjacent end 312 and faces to the second primary light-emitting element 313b of the second chip 310b is set to a light emission disabled state.

Figure 7D:
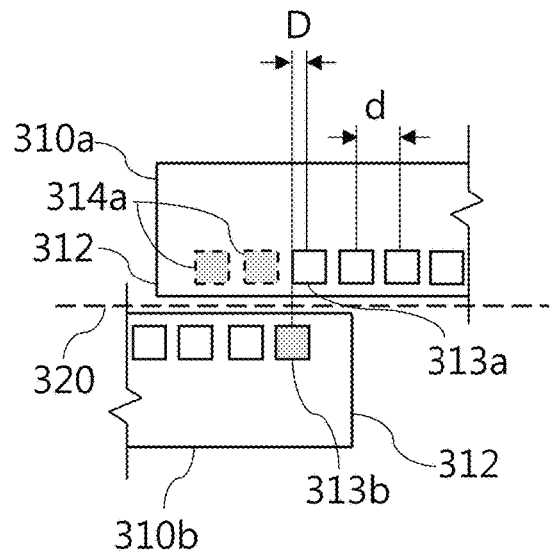
FIG. 7D is another schematic diagram of a light-emitting chip inward shifted according to a second implementation of an embodiment of the present invention.

FIG. 7D is another schematic diagram of a light-emitting chip 310 inward shifted according to a second implementation of an embodiment of the present invention. The same as FIG. 7C, FIG. 7D also shows a situation (inward shifting) that the transverse spacing D of the light-emitting chip 310 in the second implementation is less than the mounting tolerance interval. FIG. 7D shows another implementation of step S560. That is to say, the second primary light-emitting element 313b of the second chip 310b that is located on the adjacent end 312 and faces to the first primary light-emitting element 313a of the first chip 310a is set to a light emission disabled state, and each first spare light-emitting element 314a is still set to a light emission disabled state.

The foregoing first implementation and second implementation describes a situation that one of the two adjacent light-emitting chips 310 has the spare light-emitting elements. A situation that both two adjacent light-emitting chips 310 have the spare light-emitting elements will be described below by using a plurality of implementations by way of example.

In some embodiments, the first chip 310a includes the first spare light-emitting element 314a, and the second chip 310b also includes at least one second spare light-emitting element 314b located on the adjacent end 312 and continuously and linearly arranged after the second primary light-emitting elements 313b. If the first chip 310a and the second chip 310b are both at a target mounting position, the first spare light-emitting elements 314a of the first chip 310a respectively face to first N second primary light-emitting elements 313b of the second chip 310b that are located on the adjacent end 312. Each two of the light-emitting elements facing to each other form a group. The second spare light-emitting elements 314b of the second chip 310b respectively face to first M first primary light-emitting elements 313a of the first chip 310a that are located on the adjacent end 312. Each two of the light-emitting elements facing to each other form a group. Each second spare light-emitting element 314b is set to a light emission disabled state. M is a quantity of the second spare light-emitting elements 314b. In other words, if the first chip 310a and the second chip 310b are both at the target mounting position, first N+M light-emitting units 311 of the first chip 310a that are located on the adjacent end 312 respectively faces to first N+M light-emitting units 311 of the second chip 310b that are located on the adjacent end 312, where N+M≥1 (in the foregoing first implementation and second implementation, N+M=1, and in the following implementations, N+M≥2). Each two of the light-emitting units facing to each other form a group. One of the two light-emitting elements in each of the groups is set to a light emission disabled state, and the other one of the two light-emitting elements is set to a light emission enabled state, so that positions of the data points can be uniformly exposed.

Figure 8A:
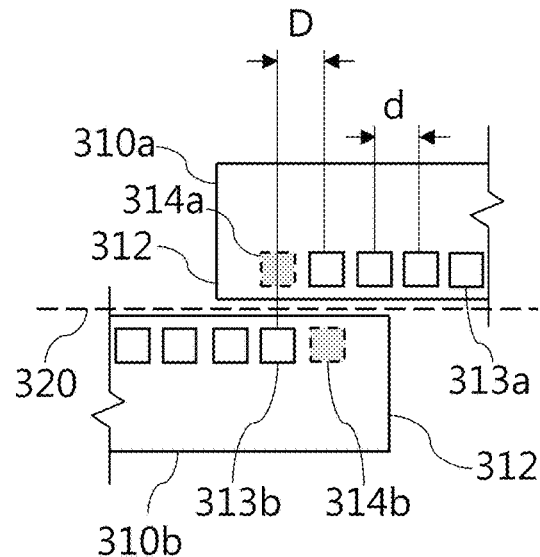
FIG. 8A is a schematic diagram of a light-emitting chip at a target mounting position according to a third implementation of an embodiment of the present invention.

FIG. 8A is a schematic diagram of a light-emitting chip 310 at a target mounting position according to a third implementation of an embodiment of the present invention. A difference between the third implementation and the first implementation lies in that, the second chip 310b of the third implementation has one spare light-emitting element located on the adjacent end 312 (that is, M=1).

Figure 8B:
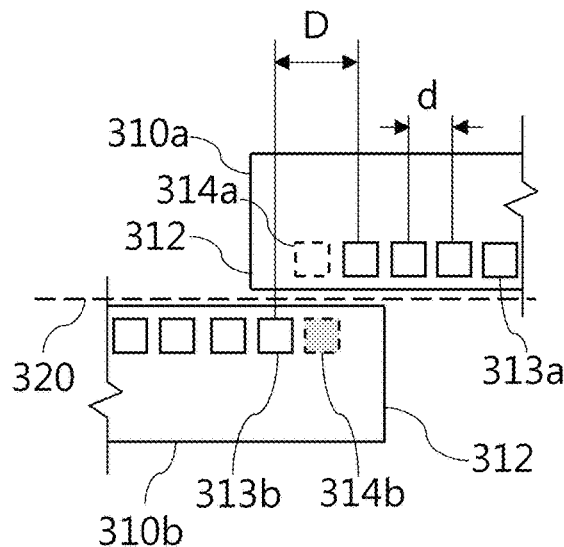
FIG. 8B is a schematic diagram of a light-emitting chip outward shifted according to a third implementation of an embodiment of the present invention.

FIG. 8B is a schematic diagram of a light-emitting chip 310 outward shifted according to a third implementation of an embodiment of the present invention. In step S550, since the first spare light-emitting element 314a of the first chip 310a does not face to the second primary light-emitting element 313b, the first spare light-emitting element is set to a light emission enabled state, and the second spare light-emitting element 314b of the second chip 310b is set to a light emission disabled state.

Figure 8C:
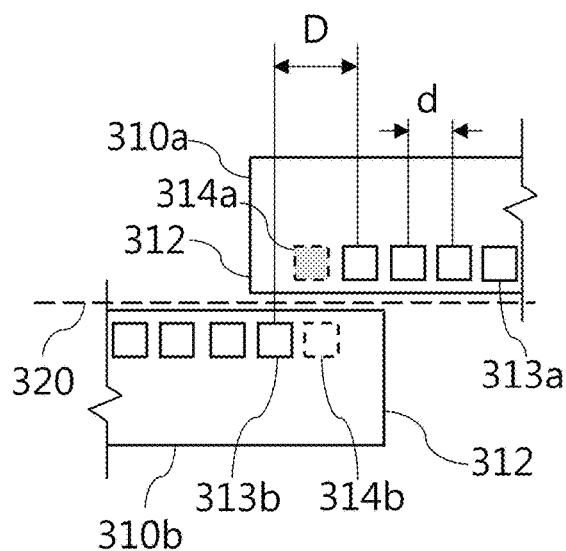
FIG. 8C is another schematic diagram of a light-emitting chip outward shifted according to a third implementation of an embodiment of the present invention.

In some embodiments, the first spare light-emitting element 314a is set to a light emission disabled state, and the second spare light-emitting element 314b not facing to the first primary light-emitting element 313a is set to a light emission enabled state. FIG. 8C is another schematic diagram of a light-emitting chip 310 outward shifted according to a third implementation of an embodiment of the present invention.

Figure 8D:
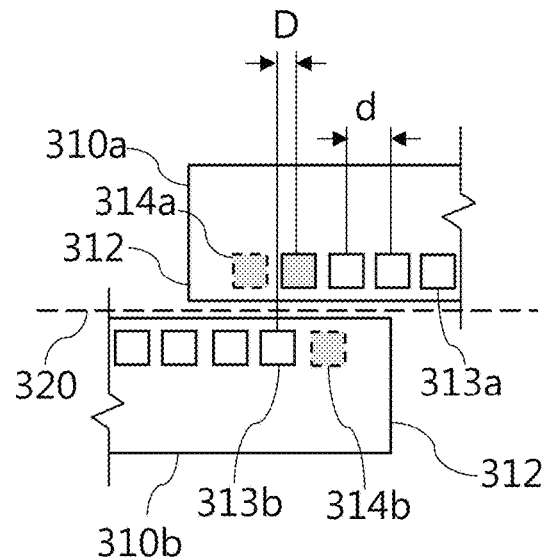
FIG. 8D is a schematic diagram of a light-emitting chip inward shifted according to a third implementation of an embodiment of the present invention.

FIG. 8D is a schematic diagram of a light-emitting chip 310 inward shifted according to a third implementation of an embodiment of the present invention. In step S560, the first spare light-emitting element 314a and the second spare light-emitting element 314b are set to a light emission disabled state. The first primary light-emitting element 313a of the first chip 310a that is located on the adjacent end 312 and faces to the second primary light-emitting element 313b of the second chip 310b is set to a light emission disabled state.

Figure 8E:
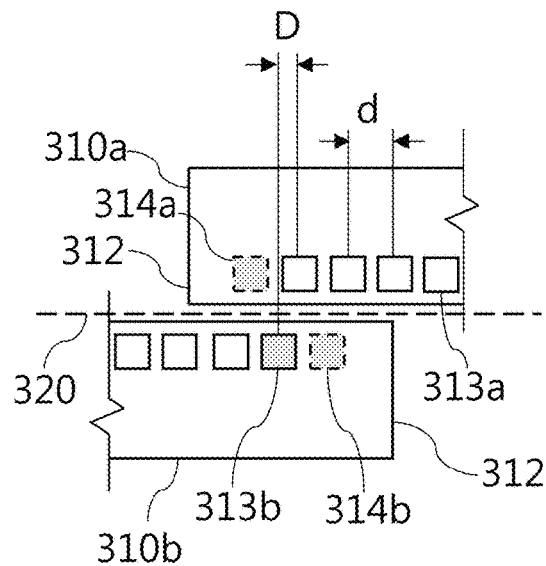
FIG. 8E is another schematic diagram of a light-emitting chip inward shifted according to a third implementation of an embodiment of the present invention.

FIG. 8E is another schematic diagram of a light-emitting chip 310 inward shifted according to a third implementation of an embodiment of the present invention. The same as FIG. 8D, FIG. 8E also shows a situation (inward shifting) that the transverse spacing D of the light-emitting chip 310 of the third implementation is less than the mounting tolerance interval. FIG. 8E shows another implementation of step S560. That is to say, the second primary light-emitting element 313b of the second chip 310b that is located on the adjacent end 312 and faces to the first primary light-emitting element 313a of the first chip 310a is set to a light emission disabled state, and the first spare light-emitting element 314a and the second spare light-emitting element 314b are still set to a light emission disabled state.

Figure 9A:
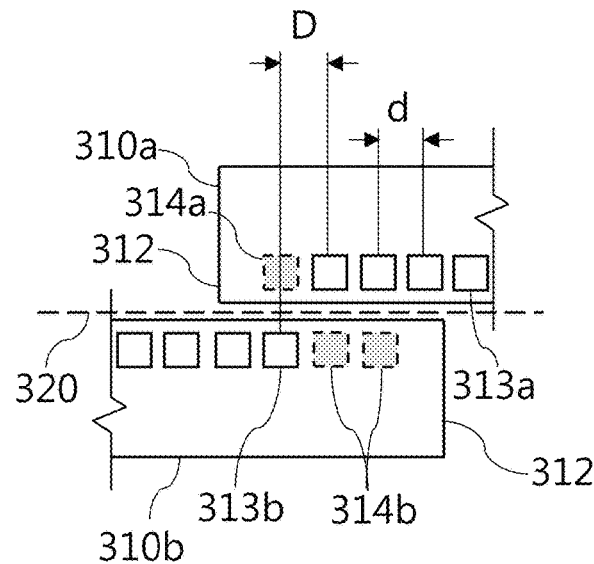
FIG. 9A is a schematic diagram of a light-emitting chip at a target mounting position according to a fourth implementation of an embodiment of the present invention.

FIG. 9A is a schematic diagram of a light-emitting chip 310 at a target mounting position according to a fourth implementation of an embodiment of the present invention. A difference between the fourth implementation and the third implementation lies in that, a quantity of the second spare light-emitting elements 314b of the second chip 310b that is located on the adjacent end 312 in the fourth implementation is two (that is, M=2).

Figure 9B:
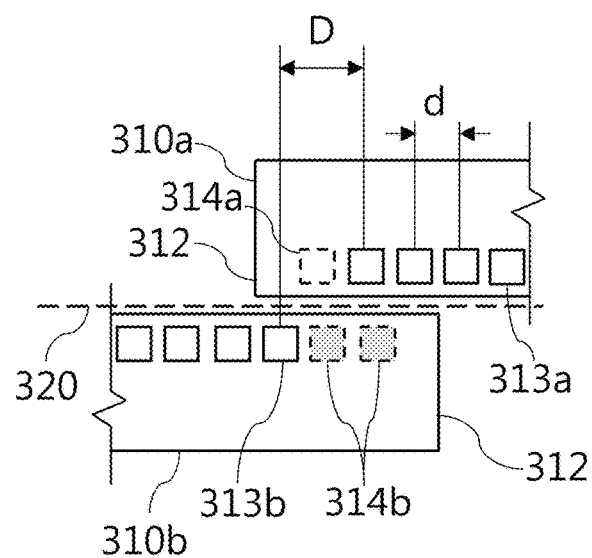
FIG. 9B is a schematic diagram of a light-emitting chip outward shifted according to a fourth implementation of an embodiment of the present invention.

FIG. 9B is a schematic diagram of a light-emitting chip 310 outward shifted according to a fourth implementation of an embodiment of the present invention. In step S550, since the first spare light-emitting element 314a of the first chip 310a does not face to the second primary light-emitting element 313b, the first spare light-emitting element is set to a light emission enabled state, and each second spare light-emitting element 314b of the second chip 310b is set to a light emission disabled state.

Figure 9C:
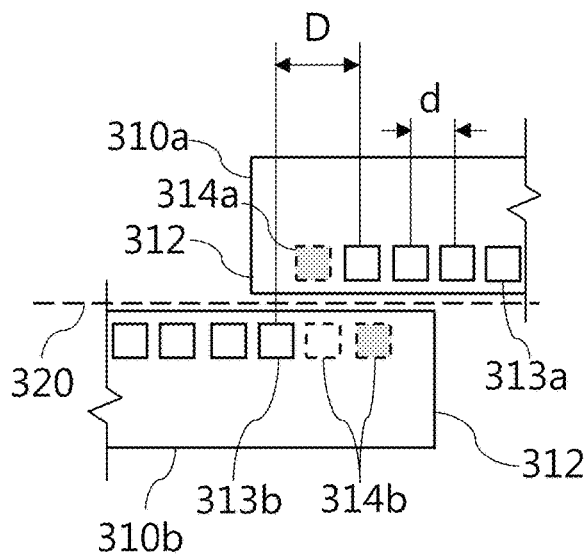
FIG. 9C is another schematic diagram of a light-emitting chip outward shifted according to a fourth implementation of an embodiment of the present invention.

In some embodiments, the first spare light-emitting element 314a is set to a light emission disabled state. The first one second spare light-emitting element 314b facing to the first primary light-emitting element 313a is set to a light emission disabled state. The second one second spare light-emitting element 314b not facing to the first primary light-emitting element 313a is set to a light emission enabled state. FIG. 9C is another schematic diagram of a light-emitting chip 310 outward shifted according to a fourth implementation of an embodiment of the present invention.

Figure 9D:
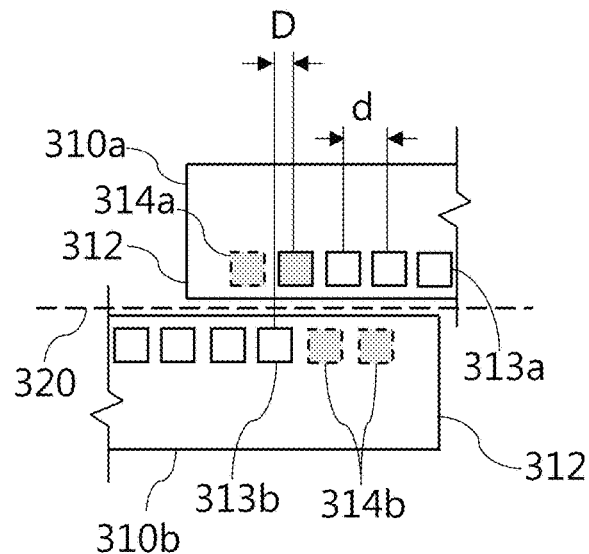
FIG. 9D is a schematic diagram of a light-emitting chip inward shifted according to a fourth implementation of an embodiment of the present invention.

FIG. 9D is a schematic diagram of a light-emitting chip 310 inward shifted according to a fourth implementation of an embodiment of the present invention. In step S560, the first spare light-emitting element 314a and each second spare light-emitting element 314b are set to a light emission disabled state. The first primary light-emitting element 313a of the first chip 310a that is located on the adjacent end 312 and faces to the second primary light-emitting element 313b of the second chip 310b is set to a light emission disabled state.

Figure 9E:
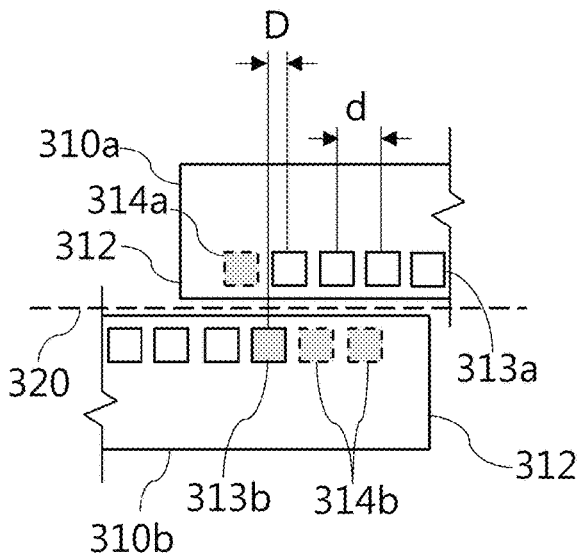
FIG. 9E is another schematic diagram of a light-emitting chip inward shifted according to a fourth implementation of an embodiment of the present invention.

FIG. 9E is another schematic diagram of a light-emitting chip 310 inward shifted according to a fourth implementation of an embodiment of the present invention. The same as FIG. 9D, FIG. 9E also shows a situation (inward shifting) that the transverse spacing D of the light-emitting chip 310 in the fourth implementation is less than the mounting tolerance interval. FIG. 9E shows another implementation of step S560. That is to say, the second primary light-emitting element 313b of the second chip 310b that is located on the adjacent end 312 and faces to the first primary light-emitting element 313a of the first chip 310a is set to a light emission disabled state, and the first spare light-emitting element 314a and each second spare light-emitting element 314b are still set to a light emission disabled state.

Figure 10A:
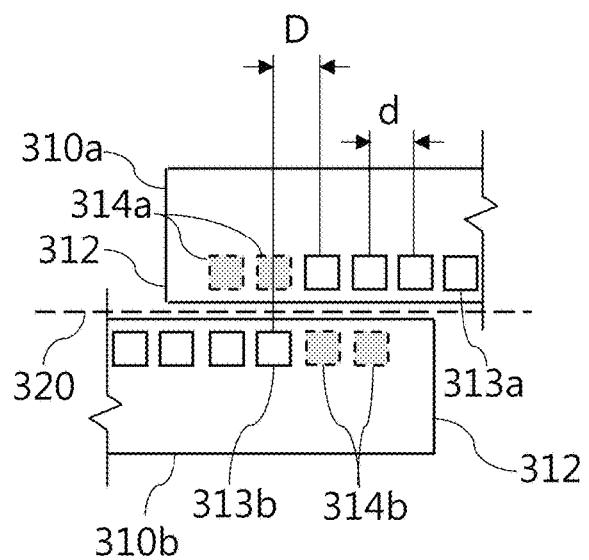
FIG. 10A is a schematic diagram of a light-emitting chip at a target mounting position according to a fifth implementation of an embodiment of the present invention.

FIG. 10A is a schematic diagram of a light-emitting chip 310 at a target mounting position according to a fifth implementation of an embodiment of the present invention. A difference between the fifth implementation and the fourth implementation lies in that, a quantity of the first spare light-emitting elements 314a of the first chip 310a that is located on the adjacent end 312 in the fifth implementation is two (that is, N=2).

Figure 10B:
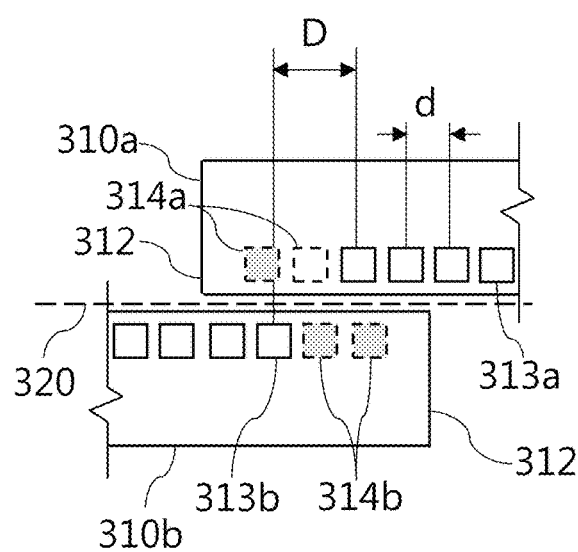
FIG. 10B is a schematic diagram of a light-emitting chip outward shifted according to a fifth implementation of an embodiment of the present invention.

FIG. 10B is a schematic diagram of a light-emitting chip 310 outward shifted according to a fifth implementation of an embodiment of the present invention. In step S550, since the first one first spare light-emitting element 314a of the first chip 310a faces to the second primary light-emitting element 313b, the first spare light-emitting element is set to a light emission disabled state. Since the second one first spare light-emitting element 314a of the first chip 310a does not face to the second primary light-emitting element 313b, the second one first spare light-emitting element is set to a light emission enabled state. Each second spare light-emitting element 314b of the second chip 310b is set to a light emission disabled state.

Figure 10C:
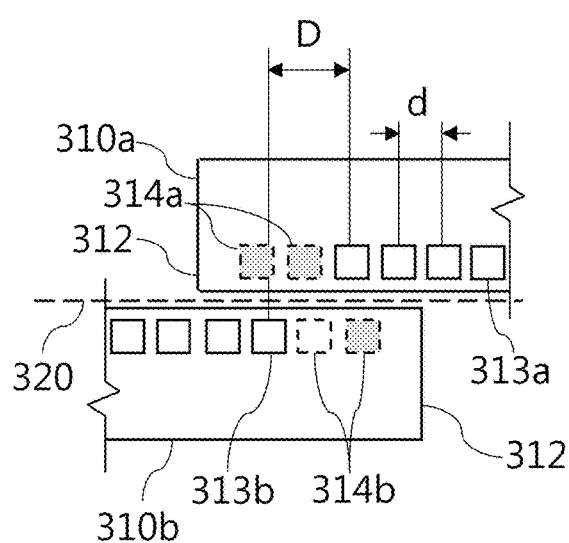
FIG. 10C is another schematic diagram of a light-emitting chip outward shifted according to a fifth implementation of an embodiment of the present invention.

In some embodiments, each first spare light-emitting element 314a is set to a light emission disabled state. The first one second spare light-emitting element 314b facing to the first primary light-emitting element 313a is set to a light emission disabled state. The second one second spare light-emitting element 314b not facing to the first primary light-emitting element 313a is set to a light emission enabled state. FIG. 10C is another schematic diagram of a light-emitting chip 310 outward shifted according to a fifth implementation of an embodiment of the present invention. In other words, each first spare light-emitting element 314a of the first chip 310a is set to a light emission disabled state. The second spare light-emitting element 314b of the second chip 310b that faces to the first primary light-emitting element 313a of the first chip 310a is set to a light emission disabled state. The second spare light-emitting element 314b of the second chip 310b that does not face to the first primary light-emitting element 313a of the first chip 310a is set to a light emission enabled state.

Figure 10D:
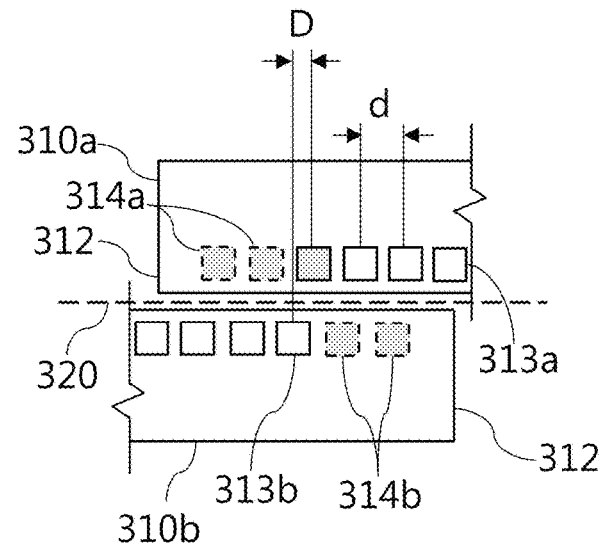
FIG. 10D is a schematic diagram of a light-emitting chip inward shifted according to a fifth implementation of an embodiment of the present invention.

FIG. 10D is a schematic diagram of a light-emitting chip 310 inward shifted according to a fifth implementation of an embodiment of the present invention. In step S560, each first spare light-emitting element 314a and each second spare light-emitting element 314b are set to a light emission disabled state. The first primary light-emitting element 313a of the first chip 310a that is located on the adjacent end 312 and does not face to the second primary light-emitting element 313b of the second chip 310b is set to a light emission disabled state.

Figure 10E:
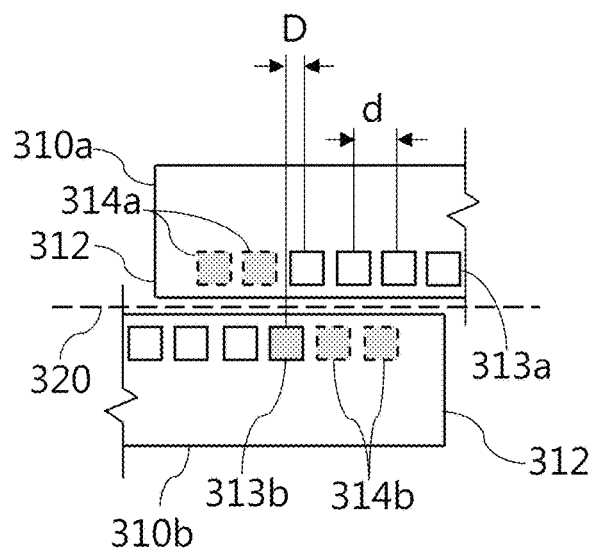
FIG. 10E is another schematic diagram of a light-emitting chip inward shifted according to a fifth implementation of an embodiment of the present invention.

FIG. 10E is another schematic diagram of a light-emitting chip 310 inward shifted according to a fifth implementation of an embodiment of the present invention. The same as FIG. 10D, FIG. 10E also shows a situation (inward shifting) that the transverse spacing D of the light-emitting chip 310 in the fourth implementation is less than the mounting tolerance interval. FIG. 10E shows another implementation of step S560. That is to say, the second primary light-emitting element 313b of the second chip 310b that is located on the adjacent end 312 and faces to the first primary light-emitting element 313a of the first chip 310a is set to a light emission disabled state, and each first spare light-emitting element 314a and each second spare light-emitting element 314b are still set to a light emission disabled state.

Figure 12:
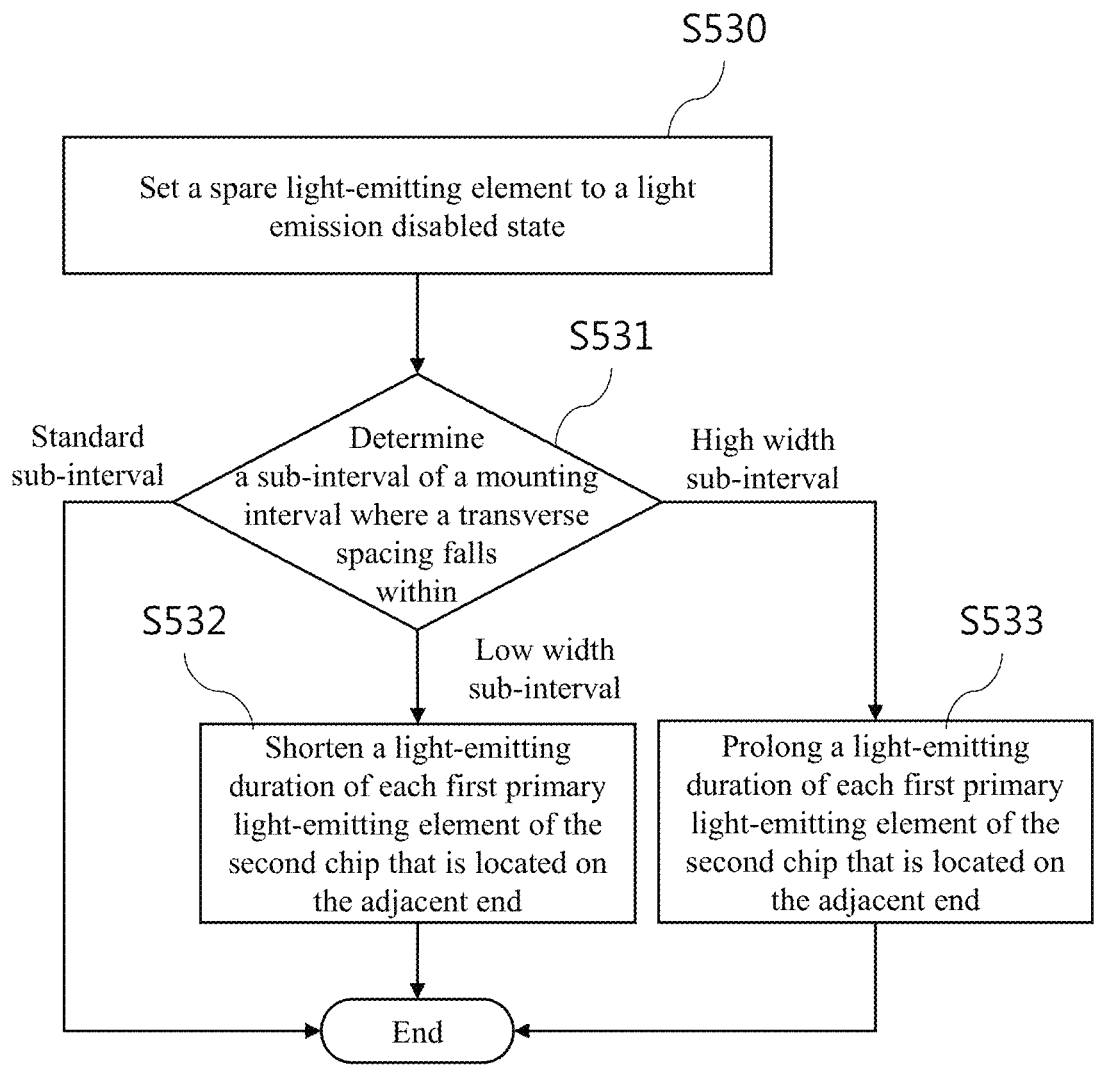
FIG. 12 is another flowchart of a method for applying a correction for mounting deviation of light-emitting chips according to an embodiment of the present invention.

FIG. 12 is another flowchart of a method for applying a correction for mounting deviation of light-emitting chips according to an embodiment of the present invention. In some embodiments, when the transverse spacing D is in the mounting tolerance interval, the process shown in FIG. 12 may be performed. An exposure duration is adjusted according to a degree of shifting. When the exposure duration is prolonged, an amount of adsorbed toner may be increased. When the exposure duration is shortened, the amount of adsorbed toner may be reduced. Therefore, the following steps may be performed after step S530 or between step S520 and step S530. The process in FIG. 12 is performed after step S530 by way of example. The mounting tolerance interval may be defined as three sub-intervals. The three sub-intervals are respectively a low width sub-interval, a standard sub-interval, and a high width sub-interval. The high width sub-interval is greater than the standard sub-interval, and the low width sub-interval is less than the standard sub-interval. In step S531, a sub-interval of a mounting interval where the transverse spacing D falls within is determined. If the transverse spacing D is in the standard sub-interval, no correction is performed. If the transverse spacing D is in the low width sub-interval, it indicates that the transverse spacing D is slightly small, and the concentration of toner requires to be reduced. Therefore, a light-emitting duration of the first primary light-emitting element of the second chip 310b that is located on the adjacent end 312 is shortened (step S532). If the transverse spacing D falls within the high width sub-interval, it indicates that the transverse spacing D is slightly large, and the concentration of the toner requires to be increased. Therefore, the light-emitting time of the first primary light-emitting element of the second chip 310b that is located on the adjacent end 312 is prolonged (step S533).

In some embodiments, the low width sub-interval is in a range of 0.4-0.5 times the adjacent spacing d. The standard sub-interval is in a range of 0.5-1.5 times the adjacent spacing d. The high width sub-interval is in a range of 1.5-1.6 times the adjacent spacing d.

In some embodiments, although the above implementations only illustrate one adjacent end 312 of the light-emitting chip 310, it is not excluded that the other adjacent end 312 of the light-emitting chip 310 also has the spare light-emitting elements. However, the embodiments of the present invention do not limit two ends of the same light-emitting chip 310 required to have a same quantity of spare light-emitting elements. In addition, the embodiments of the present invention do not limit both ends of the same light-emitting chip 310 having the spare light-emitting elements either. Alternatively, only one end of the light-emitting chip has the spare light-emitting elements. It may be understood that, for example, in the first implementation and the second implementation, some of the light-emitting chips 310 do not have the spare light-emitting elements.

In some embodiments, as shown in FIG. 10B and FIG. 10C, or as shown in FIG. 10D and FIG. 10E, in the same shifting situation, there may be different lighting methods. Therefore, the embodiments of the present invention do not limit both ends of the same light-emitting chip 310 being lighted in the same manner, as long as the process in FIG. 11 is followed.

In some embodiments, two ends of the light-emitting chip 310 have the same quantity of spare light-emitting elements. The spare light-emitting elements of the first chip 310a and the second chip 310b have a same quantity. Therefore, the same light-emitting chip 310 may be adapted to be placed on any side of the axis 320. That is to say, only the light-emitting chips 310 having a same specification require to be manufactured, so as to serve as the first chip 310a or the second chip 310b.

In some embodiments, a storage unit is disposed in or externally connected to the driving circuit 400, and may be a non-volatile storage medium, such as a flash memory. The storage unit is configured to store the foregoing parameter settings. That is to say, each light-emitting unit 311 is set to a light emission enabled state or a light emission disabled state, and it is determined whether the light-emitting duration requires to be prolonged or shortened. In this way, the driving circuit 400 may read the settings stored by the storage unit, so as to generate corresponding control signals.

Referring to FIG. 5, in some embodiments, the light-emitting units 311 are lighted in order by using a shift circuit. Last S thyristors T in the lighting order are used for load balancing, so that the thyristors T before the S thyristors T can be stably lighted during a predetermined light-emitting duration. Therefore, although the S thyristors T may have a same structure as other thyristors T, the S thyristors T are not used for exposure. All of the light-emitting units 311 (the primary light-emitting elements and the spare light-emitting elements) described herein do not include the S thyristors T. A quantity of the S thyristors T equals a quantity of shift signal lines φ1 and φ2, and the quantity is two herein.

According to a method and printing head for applying a correction for mounting deviation of light-emitting chips provided in the embodiments of the present invention, a specific light-emitting unit can be set to a light emission enabled state or to a light emission disabled state when the mounting deviation of the light-emitting chips occurs. Slight mounting deviation can be adjusted by controlling the light-emitting duration. In this way, the printing head can be uniformly exposed, and the printing definition can be enhanced. In addition, steps for adjustment are concise and convenient.

What is claimed is:

1. A printing head for applying a correction for mounting deviation of light-emitting chips, the printing head comprising:
   a substrate; and
   a plurality of light-emitting chips, arranged on the substrate along an axis and staggered at intervals on two sides of the axis, wherein each light-emitting chip comprises a plurality of primary light-emitting elements linearly arranged in parallel to the axis, a first chip and a second chip in the light-emitting chips that are adjacent to each other each have an adjacent end, and the first chip further comprises at least one first spare light-emitting element located on the adjacent end and continuously and linearly arranged after the primary light-emitting elements; and
   if the first chip and the second chip are both at a target mounting position, the at least one first spare light-emitting element of the first chip respectively faces to first N primary light-emitting elements of the second chip that are located on the adjacent end, each two of the light-emitting elements facing to each other form a group, each first spare light-emitting element is set to a light emission disabled state, and N is a quantity of the first spare light-emitting elements, wherein a transverse spacing exits between vertical projections, on the axis, of the first primary light-emitting elements of the first chip and the second chip that are located on the adjacent end, and if the transverse spacing falls within a mounting tolerance interval, each first spare light-emitting element of the first chip is set to a light emission disabled state.

2. The printing head for applying a correction for mounting deviation of light-emitting chips according to claim 1, wherein the second chip further comprises at least one second spare light-emitting element located on the adjacent end and continuously and linearly arranged after the primary light-emitting elements, if the first chip and the second chip are both at the target mounting position, the at least one second spare light-emitting element of the second chip respectively faces to first M primary light-emitting elements of the first chip that are located on the adjacent end, each two of the light-emitting elements facing to each other form a group, each second spare light-emitting element is set to a light emission disabled state, and M is a quantity of the second spare light-emitting elements.

3. The printing head for applying a correction for mounting deviation of light-emitting chips according to claim 1, wherein the mounting tolerance interval defines a low width sub-interval less than a standard sub-interval, and if the transverse spacing falls within the low width sub-interval, the first primary light-emitting element of the first chip or the second chip that is located on the adjacent end is set to a light emission shortened state.

4. The printing head for applying a correction for mounting deviation of light-emitting chips according to claim 1, wherein the mounting tolerance interval defines a high width sub-interval greater than the standard sub-interval, and if the transverse spacing falls within the high width sub-interval, the first primary light-emitting element of the first chip or the second chip that is located on the adjacent end is set to a light emission prolonged state.

5. The printing head for applying a correction for mounting deviation of light-emitting chips according to claim 1, wherein a transverse spacing exists between vertical projections, on the axis, of the first primary light-emitting elements of the first chip and the second chip that are located on the adjacent end, and if the transverse spacing is greater than a mounting tolerance interval, each first spare light-emitting element of the first chip that does not face to each primary light-emitting element of the second chip is set to a light emission enabled state.

6. The printing head for applying a correction for mounting deviation of light-emitting chips according to claim 5, wherein if the transverse spacing is greater than the mounting tolerance interval, each first spare light-emitting element of the first chip that faces to the each primary light-emitting element of the second chip is set to a light emission disabled state.

7. The printing head for applying a correction for mounting deviation of light-emitting chips according to claim 6, wherein the second chip further comprises at least one second spare light-emitting element located on the adjacent end and continuously and linearly arranged after the primary light-emitting elements, and if the transverse spacing is greater than the mounting tolerance interval, each second spare light-emitting element of the second chip is set to a light emission disabled state.

8. The printing head for applying a correction for mounting deviation of light-emitting chips according to claim 1, wherein the second chip further comprises at least one second spare light-emitting element located on the adjacent end and continuously and linearly arranged after the primary light-emitting elements, a transverse spacing exists between vertical projections, on the axis, of the first primary light-emitting elements of the first chip and the second chip that are located on the adjacent end, if the transverse spacing is greater than a mounting tolerance interval, each first spare light-emitting element of the first chip is set to a light emission disabled state, each second spare light-emitting element of the second chip that faces to each primary light-emitting element of the first chip is set to a light emission disabled state, and each second spare light-emitting element of the second chip that does not face to the each primary light-emitting element of the first chip is set to a light emission enabled state.

9. The printing head for applying a correction for mounting deviation of light-emitting chips according to claim 1, wherein a transverse spacing exists between vertical projections, on the axis, of the first primary light-emitting elements of the first chip and the second chip that are located on the adjacent end, if the transverse spacing is less than a mounting tolerance interval, each first spare light-emitting element of the first chip is set to a light emission disabled state, and the primary light-emitting element of the second chip that is located on the adjacent end and faces to the primary light-emitting element of the first chip is set to a light emission disabled state.

10. The printing head for applying a correction for mounting deviation of light-emitting chips according to claim 9, wherein the second chip further comprises at least one second spare light-emitting element located on the adjacent end and continuously and linearly arranged after the primary light-emitting elements, and if the transverse spacing is less than the mounting tolerance interval, each second spare light-emitting element of the second chip is set to a light emission disabled state.

11. The printing head for applying a correction for mounting deviation of light-emitting chips according to claim 1, wherein a transverse spacing exists between vertical projections, on the axis, of the first primary light-emitting elements of the first chip and the second chip that are located on the adjacent end, if the transverse spacing is less than a mounting tolerance interval, each first spare light-emitting element of the first chip is set to a light emission disabled state, and the primary light-emitting element of the first chip that is located on the adjacent end and faces to the primary light-emitting element of the second chip is set to a light emission disabled state.

12. A method for applying a correction for mounting deviation of light-emitting chips, applicable to a printing head, wherein the printing head comprises a substrate and a plurality of light-emitting chips mounted on the substrate, the light-emitting chips are arranged along an axis and staggered at intervals on two sides of the axis, each light-emitting chip comprises a plurality of primary light-emitting elements linearly arranged in parallel to the axis, a first chip and a second chip in the light-emitting chips that are adjacent to each other each have an adjacent end, the first chip further comprises at least one first spare light-emitting element located on the adjacent end and continuously and linearly arranged after the primary light-emitting elements, if the first chip and the second chip are both at a target mounting position, the at least one first spare light-emitting element of the first chip respectively faces to first N primary light-emitting elements of the second chip that are located on the adjacent end, N is a quantity of the first spare light-emitting elements, each two of the light-emitting elements facing to each other form a group, and the method for applying a correction for mounting deviation of light-emitting chips comprises:
  measuring a transverse spacing between vertical projections, on the axis, of first primary light-emitting elements of the first chip and the second chip that are located on the adjacent end;
  determining whether the transverse spacing falls within a mounting tolerance interval; and
  if the transverse spacing falls within the mounting tolerance interval, setting each first spare light-emitting element of the first chip to a light emission disabled state.

13. The method for applying a correction for mounting deviation of light-emitting chips according to claim 12, wherein the second chip further comprises at least one second spare light-emitting element located on the adjacent end and continuously and linearly arranged after the primary light-emitting elements, if the first chip and the second chip are both at the target mounting position, the at least one second spare light-emitting element of the second chip respectively faces to first M primary light-emitting elements of the first chip that are located on the adjacent end, M is a quantity of the second spare light-emitting elements, each two of the light-emitting elements facing to each other form a group, and the method for applying a correction for mounting deviation of light-emitting chips further comprises: if the transverse spacing falls within the mounting tolerance interval, setting each second spare light-emitting element of the second chip to a light emission disabled state.

14. The method for applying a correction for mounting deviation of light-emitting chips according to claim 12, wherein the mounting tolerance interval defines a low width sub-interval less than a standard sub-interval, and the method for applying a correction for mounting deviation of light-emitting chips further comprises:
  determining whether the transverse spacing falls within the low width sub-interval; and if the transverse spacing falls within the low width sub-interval, shortening a light-emitting duration of the first primary light-emitting element of the first chip or the second chip that is located on the adjacent end.

15. The method for applying a correction for mounting deviation of light-emitting chips according to claim 12, wherein the mounting tolerance interval defines a high width sub-interval greater than a standard sub-interval, and the method for applying a correction for mounting deviation of light-emitting chips further comprises:
   determining whether the transverse spacing falls within the high width sub-interval; and
   if the transverse spacing falls within the high width sub-interval, prolonging a light-emitting duration of the first primary light-emitting element of the first chip or the second chip that is located on the adjacent end.

16. The method for applying a correction for mounting deviation of light-emitting chips according to claim 12, the method further comprising:
   if the transverse spacing is greater than the mounting tolerance interval, setting, to a light emission enabled state, each first spare light-emitting element of the first chip that does not face to each primary light-emitting element of the second chip.

17. The method for applying a correction for mounting deviation of light-emitting chips according to claim 16, the method further comprising:
   if the transverse spacing is greater than the mounting tolerance interval, setting, to a light emission disabled state, each first spare light-emitting element of the first chip that faces to the each primary light-emitting element of the second chip.

18. The method for applying a correction for mounting deviation of light-emitting chips according to claim 17, wherein the second chip further comprises at least one second spare light-emitting element located on the adjacent end and continuously and linearly arranged after the primary light-emitting elements, and the method for applying a correction for mounting deviation of light-emitting chips further comprises: if the transverse spacing is greater than the mounting tolerance interval, setting each second spare light-emitting element of the second chip to a light emission disabled state.

19. The method for applying a correction for mounting deviation of light-emitting chips according to claim 12, wherein the second chip further comprises at least one second spare light-emitting element located on the adjacent end and continuously and linearly arranged after the primary light-emitting elements, and the method for applying a correction for mounting deviation of light-emitting chips further comprises: if the transverse spacing is greater than the mounting tolerance interval, setting each first spare light-emitting element of the first chip to a light emission disabled state, setting, to a light emission disabled state, each second spare light-emitting element of the second chip that faces to each primary light-emitting element of the first chip, and setting, to a light emission enabled state, each second spare light-emitting element of the second chip that does not face to the each primary light-emitting element of the first chip.

20. The method for applying a correction for mounting deviation of light-emitting chips according to claim 12, the method further comprising:
   if the transverse spacing is less than the mounting tolerance interval, setting each first spare light-emitting element of the first chip to a light emission disabled state, and setting, to a light emission disabled state, each primary light-emitting element of the second chip that is located on the adjacent end and faces to the each primary light-emitting element of the first chip.

21. The method for applying a correction for mounting deviation of light-emitting chips according to claim 20, wherein the second chip further comprises at least one second spare light-emitting element located on the adjacent end and continuously and linearly arranged after the primary light-emitting elements, and if the transverse spacing is less than the mounting tolerance interval, each second spare light-emitting element of the second chip is set to a light emission disabled state.

22. The method for applying a correction for mounting deviation of light-emitting chips according to claim 12, wherein the second chip further comprises at least one second spare light-emitting element located on the adjacent end and continuously and linearly arranged after the primary light-emitting elements, and the method for applying a correction for mounting deviation of light-emitting chips further comprises: if the transverse spacing is less than the mounting tolerance interval, setting each first spare light-emitting element of the first chip to a light emission disabled state, and setting, to a light emission disabled state, each primary light-emitting element of the first chip that is located on the adjacent end and faces to each primary light-emitting element of the second chip.

\* \* \* \* \*